(12) United States Patent
Sawada et al.

(10) Patent No.: US 11,217,288 B2
(45) Date of Patent: Jan. 4, 2022

(54) MAGNETIC DEVICE AND MEMORY DEVICE

(71) Applicant: TOSHIBA MEMORY CORPORATION, Tokyo (JP)

(72) Inventors: Kazuya Sawada, Seoul (KR); Young Min Eeh, Seongnam-si (KR); Tadaaki Oikawa, Seoul (KR); Kenichi Yoshino, Seongnam-si (KR); Eiji Kitagawa, Seoul (KR); Taiga Isoda, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/566,472

(22) Filed: Sep. 10, 2019

(65) Prior Publication Data

US 2020/0302987 A1    Sep. 24, 2020

(30) Foreign Application Priority Data

Mar. 18, 2019   (JP) .............................. JP2019-049562

(51) Int. Cl.
*H01L 27/22* (2006.01)
*G11C 11/16* (2006.01)
*H01L 43/10* (2006.01)
*H01L 43/08* (2006.01)

(52) U.S. Cl.
CPC .......... *G11C 11/161* (2013.01); *H01L 27/222* (2013.01); *H01L 43/08* (2013.01); *H01L 43/10* (2013.01)

(58) Field of Classification Search
CPC .......... G11C 11/161; G11C 2211/5615; G11C 19/02–10; H01L 43/10; H01L 43/08; H01L 27/228; H01L 27/222–228; H01L 43/12; H01L 29/82; G01R 33/098; H01F 10/3218; H01F 10/324; H01F 10/28
See application file for complete search history.

(56) References Cited

U.S. PATENT DOCUMENTS

| | | | |
|---|---|---|---|
| 10,818,837 B1 * | 10/2020 | Otani | H01L 43/08 |
| 2003/0179071 A1 | 9/2003 | Hiramoto et al. | |
| 2006/0094129 A1 * | 5/2006 | Pinarbasi | G11B 5/3169 |
| | | | 438/3 |
| 2014/0103469 A1 * | 4/2014 | Jan | H01F 41/307 |
| | | | 257/421 |
| 2016/0064648 A1 | 3/2016 | Tsubata et al. | |
| 2017/0256320 A1 * | 9/2017 | Lang | G11C 16/3445 |

(Continued)

FOREIGN PATENT DOCUMENTS

| | | | |
|---|---|---|---|
| JP | 3571888 B2 | 9/1997 | |
| JP | 3585807 B2 | 4/2000 | |

(Continued)

*Primary Examiner* — Shahed Ahmed
(74) *Attorney, Agent, or Firm* — Holtz, Holtz & Volek PC

(57) ABSTRACT

According to one embodiment, a magnetic device includes: a first magnetic material provided above a substrate; a second magnetic material provided between the substrate and the first magnetic material; a nonmagnetic material provided between the first magnetic material and the second magnetic material; a first layer provided between the substrate and the second magnetic material and including an amorphous layer; and a second layer provided between the amorphous layer and the second magnetic material and including a crystal layer.

18 Claims, 10 Drawing Sheets

(56) References Cited

U.S. PATENT DOCUMENTS

| | | | |
|---|---|---|---|
| 2017/0294375 A1 | 10/2017 | Terada et al. | |
| 2018/0076261 A1 | 3/2018 | Yoshikawa et al. | |
| 2019/0043548 A1 | 2/2019 | Park et al. | |
| 2019/0097124 A1* | 3/2019 | Lee | H01L 43/02 |
| 2020/0357450 A9* | 11/2020 | Park | H01L 43/02 |
| 2020/0395534 A1* | 12/2020 | Liu | H01L 43/08 |

FOREIGN PATENT DOCUMENTS

| | | |
|---|---|---|
| TW | 201123569 A | 7/2011 |
| TW | 201626507 A | 7/2016 |
| WO | 02093661 A1 | 11/2002 |
| WO | 2004070710 A1 | 8/2004 |
| WO | 2011072058 A2 | 6/2011 |

\* cited by examiner

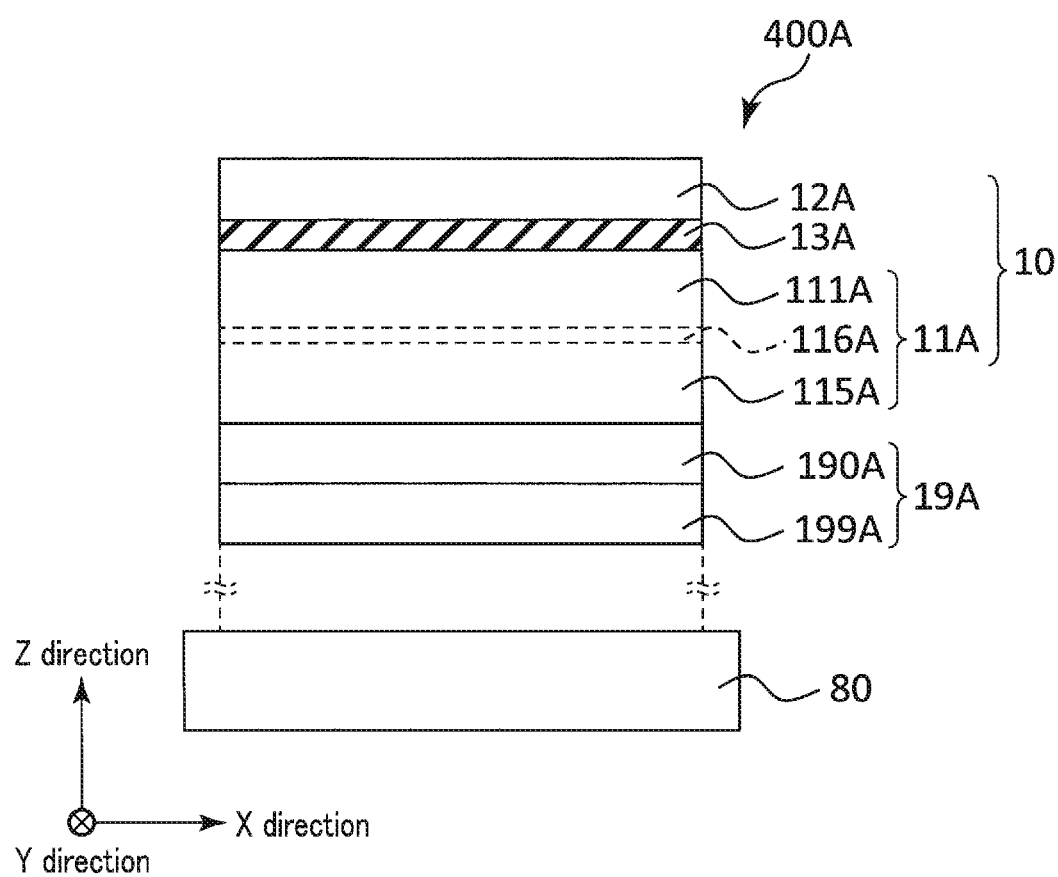
F I G. 1

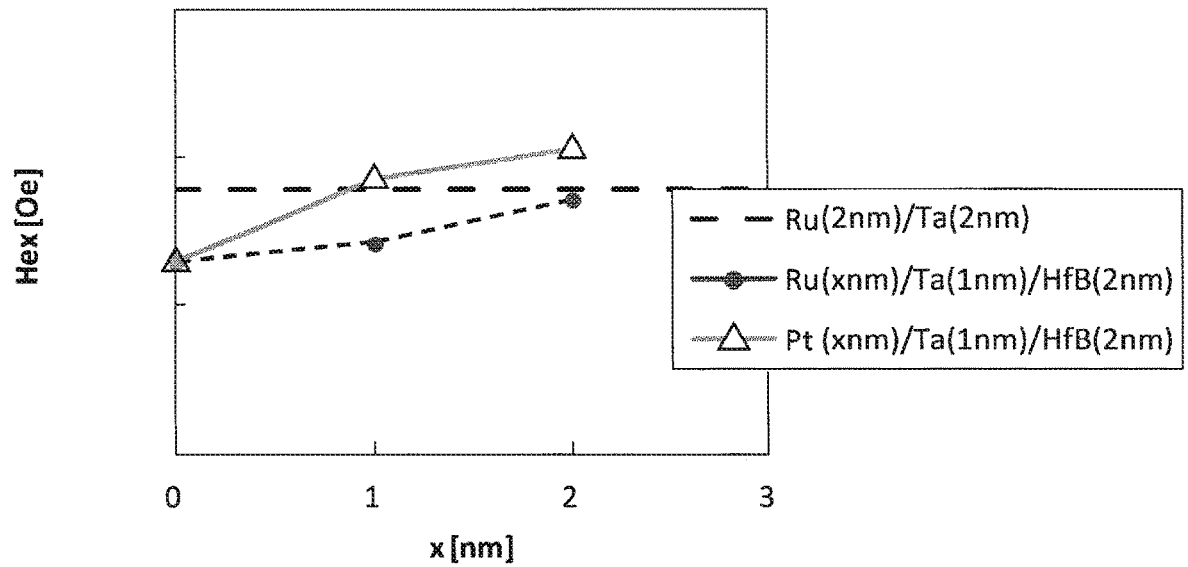
F I G. 5
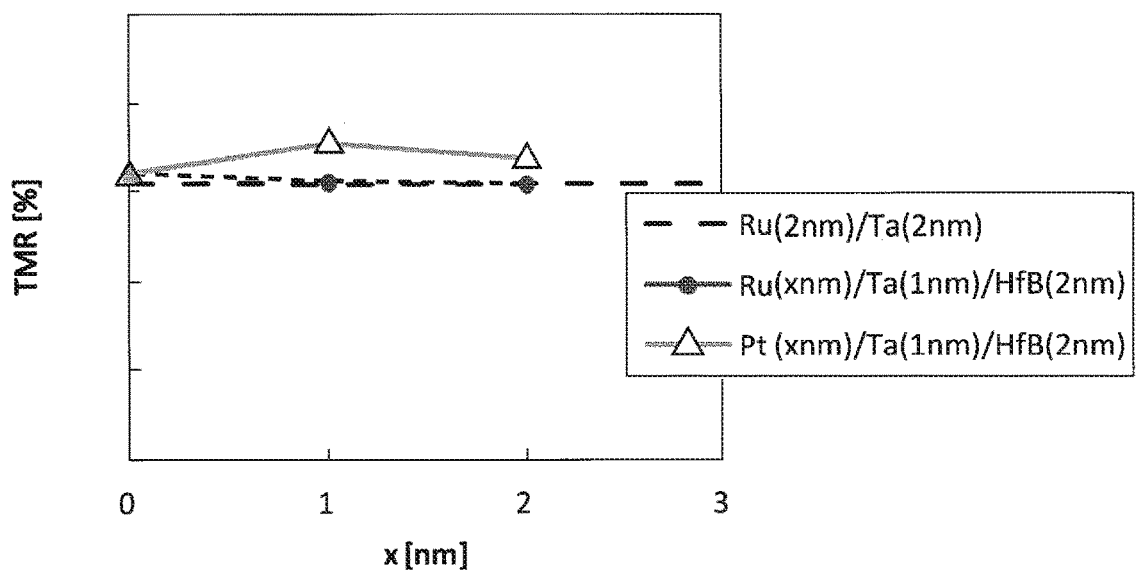
F I G. 6

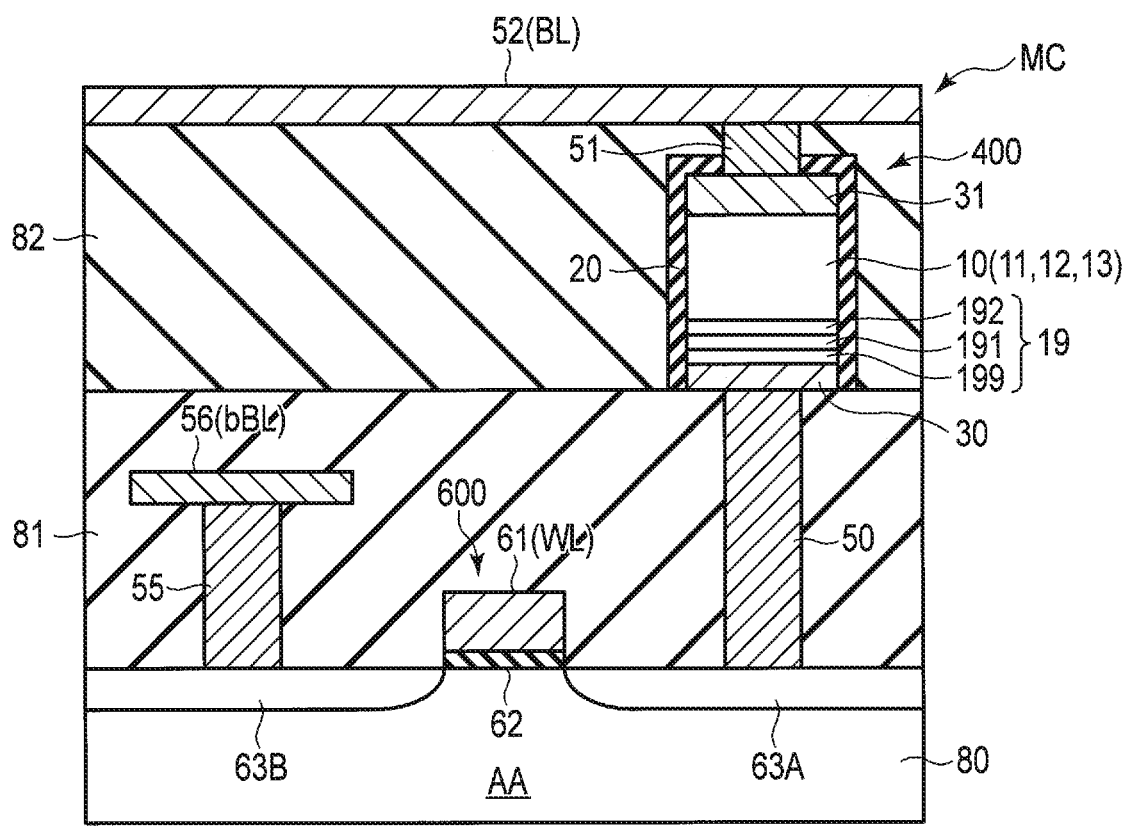
F I G. 13

MAGNETIC DEVICE AND MEMORY DEVICE

CROSS-REFERENCE TO RELATED APPLICATIONS

This application is based upon and claims the benefit of priority from Japanese Patent Application No. 2019-049562, filed Mar. 18, 2019, the entire contents of which are incorporated herein by reference.

FIELD

Embodiments described herein relate generally to a magnetic device and a memory device.

BACKGROUND

In order to improve the characteristics of magnetoresistive effect elements, the study and development of structures and structural members of the elements have been promoted.

BRIEF DESCRIPTION OF THE DRAWINGS

FIG. 1 is a diagram illustrating a basic example of a magnetic device according to an embodiment.

FIGS. 3, 4, 5, 6, 7, 8 and 9 are graphs illustrating the characteristics of the magnetic device according to the embodiment.

FIGS. 11, 12 and 13 are diagrams illustrating an application example of the magnetic device according to the embodiment.

DETAILED DESCRIPTION

Embodiment

Figure 2:
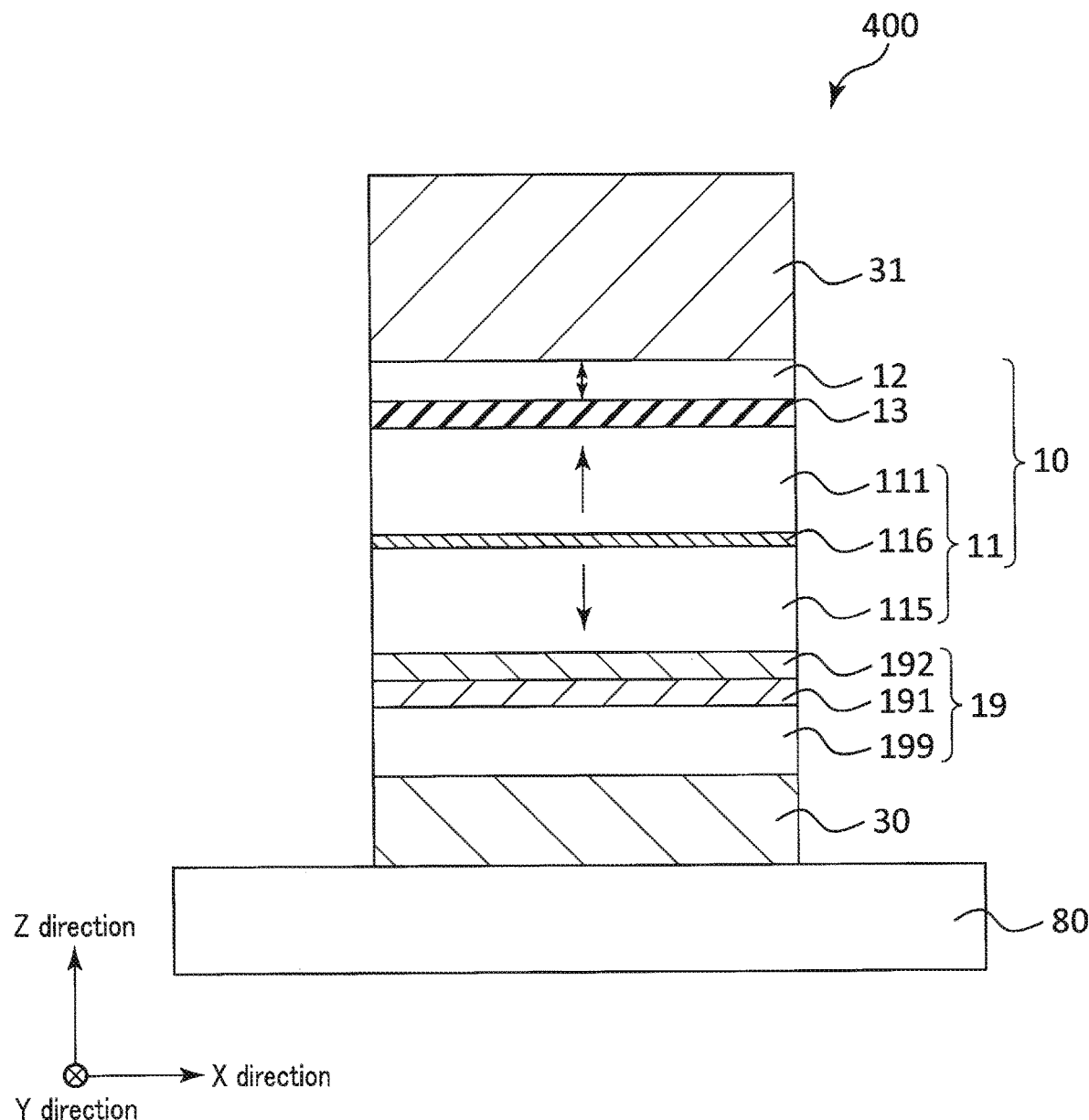
FIG. 2 is a diagram illustrating an example of a configuration of the magnetic device according to the embodiment.

An embodiment will be described in detail below with reference to FIGS. 1 through 13. In the following descriptions, the elements having the same function and configuration are denoted by the same reference numeral or sign.

If the elements denoted by reference signs with numerals or letters at their ends (e.g. word lines, bit lines, and various voltages and signals) need not be distinguished from one another, the numerals or letters will be excluded.

In general, according to one embodiment, a magnetic device includes: a first magnetic material provided above a substrate; a second magnetic material provided between the substrate and the first magnetic material; a nonmagnetic material provided between the first magnetic material and the second magnetic material; a first layer provided between the substrate and the second magnetic material and including an amorphous layer; and a second layer provided between the amorphous layer and the second magnetic material and including a crystal layer.

(1) Embodiment

A magnetic device according to an embodiment and a method of manufacturing the magnetic device will be described with reference to FIGS. 1 through 9.

(a) Basic Example

A basic example of the magnetic device according to the embodiment will be described with reference to FIG. 1.

FIG. 1 is a schematic sectional view showing a basic configuration of a magnetoresistive effect element 400A of the present embodiment.

As shown in FIG. 1, the magnetoresistive effect element 400A includes two magnetic materials 11A and 12A, a nonmagnetic material 13A and an underlying layer (nonmagnetic material) 19A. Note that the nonmagnetic material may be referred to as the nonmagnetic material layer, and the magnetic material may be referred to as the magnetic material layer.

The magnetic materials 11A and 12A are provided above a substrate 80 in a direction perpendicular to the surface of the substrate 80 (which is defined as a Z direction here).

The magnetic material 11A is provided between the magnetic material 12A and the substrate 80. The magnetic material 11A includes at least one magnetic layer 111A.

The magnetic material 11A includes, for example, two magnetic layers 111A and 115A and a nonmagnetic layer 116A. The magnetic layer 111A is provided above the magnetic layer 115A in the Z direction. The nonmagnetic layer 116A is provided between two magnetic layers 111A and 115A. The nonmagnetic layer 116A is a metal layer.

As described above, the magnetic material 11A is a stack including a plurality of layers 111A, 115A and 116A stacked in the Z direction.

For example, the magnetic material 11A has a synthetic antiferromagnetic (SAF) structure. The two magnetic layers 111A and 115A of the magnetic material 11A are antiferromagnetically bonded to each other with the nonmagnetic metal layer 116A therebetween. In the SAF structure, the direction of magnetization of the magnetic layer 111A is opposite to that of magnetization of the magnetic layer 115A.

Hereinafter, the magnetic material 11A will also be referred to as an SAF structure (or an SAF layer) 11A.

The nonmagnetic material 13A is provided between the magnetic material 11A and the magnetic material 12A.

The underlying layer 19A is provided between the SAF structure 11A and the substrate 80.

The underlying layer 19A is a stack. The underlying Layer 19A includes a plurality of layers 190A and 199A. The layer 199A is provided between the magnetic material 11A and the substrate 80. The layer 190A is provided between the magnetic material 11A and the layer 199A. The underlying layer 19A is thus a stack including a plurality of layers stacked in the Z direction.

The underlying layer 19A functions as a layer for improving the characteristics of the magnetic material 11A.

One or more layers (members) may be provided between the substrate 80 and the magnetic material 11A.

The magnetic device of the present embodiment corresponds to the magnetoresistive effect element 400A. The magnetoresistive effect element 400A can take a plurality of resistance states (a magnetoresistance value and a resistance value) in accordance with the relative magnetization alignment of the two magnetic materials 11A and 12A.

In the present embodiment, the layer 199A of the underlying layer 19A is a layer including an amorphous layer (hereinafter referred to as an amorphous layer).

In the present embodiment, the layer 190A of the underlying layer 19A is a layer including a crystal layer (hereinafter referred to as a crystal layer). The crystal layer 190A has a single-layer structure or a multi-layer structure.

The amorphous layer 199A is provided on the undersurface of the crystal layer 190A in the Z direction. The amorphous layer 199A prevents the crystal properties (e.g. crystal information and defect information) of a layer (e.g.

the substrate 80 and a conductive layer) under the amorphous layer 199A from being propagated (transcribed) to a layer (e.g. the crystal layer 190A and the magnetic material 11A) above the amorphous layer 199A. The crystal layer 190A can promote the crystal growth of the magnetic material 11A.

Since the amorphous layer 199A prevents the crystal properties of a layer under the amorphous layer 199A from being propagated, the crystal of the magnetic material 11A grows, generally depending upon the crystal properties of the crystal layer 190A. In the present embodiment, therefore, the crystal of the magnetic material 11A is improved in its uniformity.

In addition, the amorphous layer 199A has relatively high flatness. Accordingly, the crystal layer 190A, magnetic materials 11A and 12A and nonmagnetic material 13A, which are provided on and above the amorphous layer 199A, are improved in their flatness.

As a result, the magnetic properties of the magnetic materials 11A and 12A are improved in the magnetoresistive effect element of the present embodiment.

Thus, the characteristics of the magnetoresistive effect element (magnetic device) of the present embodiment are improved.

(b) Configuration Example

The configuration of the magnetoresistive effect element (MTJ element) 400 of the present embodiment will be described with reference to FIG. 2.

FIG. 2 is a schematic sectional view showing a configuration example of the magnetoresistive effect element according to the present embodiment. For clarification, a protection film and an interlayer insulating film, which cover the element, are excluded from FIG. 2.

As illustrated in FIG. 2, the magnetoresistive effect element 400 of the present embodiment has a rectangular sectional shape. However, the magnetoresistive effect element 400 may have a trapezoidal sectional shape of the base shape. For example, a plane shape (a shape in a view from Z-direction) of the MTJ element 400 may be circular, elliptical or quadrangular (e.g. square and rectangular). When the MTJ element is rectangular, the corners of the magnetic layer may be rounded.

The magnetoresistive effect element 400 of the present embodiment includes stacks 10 and 19 and two electrodes 30 and 31. The stack 10 is provided between the two electrodes 30 and 31. The stack 19 is provided between the stack 10 and the electrode 30.

The electrode 30 is provided at one end of the magnetoresistive effect element 400 in the Z direction. The electrode 31 is provided at the other end thereof in the Z direction. The electrode 31 is provided above the electrode 30 in the Z direction. Hereinafter, the electrode 30 will be referred to as a lower electrode 30 and the electrode 31 will be referred to as an upper electrode 31.

The materials of the electrodes 30 and 31 include at least one of Ruthenium (Ru), tungsten (W), tantalum (Ta), tantalum nitride (TaN), titanium (Ti), titanium nitride (TiN) and the like.

Incidentally, each of the electrodes 30 and 31 may have a single-layer structure or a multilayer structure.

The stack 10 includes at least two magnetic materials 11 and 12 and a nonmagnetic material 13.

The magnetic material 11 is provided between the lower electrode 30 and the nonmagnetic material 13. The magnetic material 12 is provided between the upper electrode 31 and the nonmagnetic material 13. The nonmagnetic material 13 is provided between the two magnetic materials 11 and 12. Between the two magnetic materials 11 and 12, a magnetic tunnel junction (MTJ) is formed through the nonmagnetic material 13.

Hereinafter, the magnetoresistive effect element including an MTJ will be referred to as an MTJ element. The nonmagnetic material 13 will be referred to as a tunnel barrier layer 13. The tunnel barrier layer 13 is, for example, an insulating film including magnesium oxide (MgO).

The magnetic material 12 has magnetization. The direction of the magnetization of the magnetic material 12 is variable. Hereinafter, the magnetic material 12 having a variable magnetization direction will be referred to as a storage layer 12. The storage layer 12 may also be referred to as a free layer, a magnetization variable layer and a magnetization free layer.

The storage layer 12 is provided between the electrode 31 and the tunnel barrier layer 13. The storage layer 12 is in contact with the electrode 31. However, one or more layers (referred to as a cap layer hereinafter) may be provided between the electrode 31 and the storage layer 12. The cap layer may include, for example, a magnesium oxide layer.

The storage layer 12 includes cobalt iron boron (CoFeB), iron boride (FeB) or the like.

The magnetic material 11 is a stack having an SAF structure. The magnetic material 11 with the SAF structure includes two magnetic layers 111 and 115 and a nonmagnetic layer 116. The nonmagnetic layer 116 is a metal layer. The nonmagnetic layer 116 is, for example, a ruthenium film (Ru film).

Each of the magnetic layers 111 and 115 has magnetization. The direction of the magnetization of the magnetic layer 115 is opposite to that of the magnetization of the magnetic layer 111. The two magnetic layers 111 and 115 are bonded anti-ferromagnetically through the metal layer 116. Thus, the magnetizations of the two magnetic layers 111 and 115 are fixed to each other.

Of the two magnetic layers 111 and 115 of the magnetic material 11 with the SAF structure, the magnetic layer 111 closer to the upper electrode 31 will be referred to as a reference layer 111. The reference layer 111 may also be referred to as a pin layer, a pinned layer, a magnetization fixed layer or a magnetization invariable layer. Of the two magnetic layers 111 and 115, the magnetic layer 115 closer to the lower electrode 30 will be referred to as a shift cancellation layer 115. Note that the magnetic layer 11 with the SAF structure may also be referred to as a reference layer.

The shift cancellation layer 115 reduces a stray magnetic field of the reference layer 111. This suppresses an adverse effect on the magnetization of the storage layer 12 due to the stray magnetic field of the reference layer 111 (e.g. a magnetic field shift).

For example, the reference layer 111 includes cobalt iron boron (CoFeB) or iron boride (FeB). The reference layer 111 may also include cobalt platinum (Copt), cobalt nickel (CoNi) or cobalt palladium (CoPd). For example, the reference layer 111 is an alloy film or a multi-layer film (e.g. an artificial lattice film) using these materials.

For example, the material of the shift cancellation layer 115 is the same as that of the reference layer 111.

The direction of magnetization of the reference layer 111 is invariable (fixed) and so is the direction of magnetization of the shift cancellation layer 115. The fact that the direction of magnetization of each of the reference layer 111 and shift cancellation layer 115 is "invariable" or "fixed" means that when the MTJ element 400 is supplied with current or voltage for reversing the direction of magnetization of the storage layer 12, the direction of magnetization of each of the reference layer 111 and shift cancellation layer 115 does not change before and after the supply of the current or voltage. As the direction of magnetization of each of the reference layer 111 and shift cancellation layer 115 is invariable, the magnetization switching threshold value of the storage layer 12, that of the reference layer 111 and that of the shift cancellation layer 115 are each controlled. If the storage layer and the reference layer (and the shift cancellation layer) are formed of the same material, the reference layer 111 is made thicker than the storage layer 12 to control the magnetization switching threshold value.

For example, the storage layer 12, the reference layer 111 and the shift cancellation layer 115 each have perpendicular magnetic anisotropy. The direction of magnetization of each of the storage layer 12, reference layer 111 and shift cancellation layer 115 is substantially perpendicular to the layer surface (film surface) of the layer 12 (and layers 111 and 115). The direction of magnetization of each of the magnetic layers 12, 111 and 115 (the direction of easy axis of magnetization) is substantially parallel to the direction in which the magnetic layers 12, 111 and 115 are stacked.

The magnetization of storage layer 12 directs toward one of the lower electrode 30 and the upper electrode 31. The fixed magnetization of the reference layer 111 is set toward one of the lower electrode 30 and the upper electrode 31 by the SAF.

The resistance state (resistance value) of the MTJ element 400 varies with the relative relationship (magnetization alignment) between the direction of magnetization of the storage layer 12 and that of magnetization of the reference layer 111.

When the direction of magnetization of the storage layer 12 is the same as that of magnetization of the reference layer 111 (when the magnetization alignment of the MTJ element 400 is parallel), the MTJ element 400 has a first resistance value R1. When the direction of magnetization of the storage layer 12 is different from that of magnetization of the reference layer 111 (when the magnetization alignment of the MTJ element 400 is antiparallel), the MTJ element 400 has a second resistance value R2 that is higher than the first resistance value R1.

In the present embodiment, the parallel alignment state of the MTJ element 400 will also be referred to as a P state and the antiparallel alignment state thereof will also be referred to as an AP state.

For example, when the direction of magnetization of the storage layer is switched by spin torque transfer (STT), write current is supplied to the MTJ element 400.

The change in magnetization alignment of the MTJ element 400 from the AP state to the P state or the change therein from the P state to the AP state is controlled according to whether write current flows from the storage layer 12 to the reference layer 111 or from the reference layer 111 to the storage layer 12. The value of the write current is smaller than the magnetization switching threshold value of the reference layer 111 and is set not smaller than the magnetization switching threshold value of the storage layer 12. Thus, spin torque that contributes to the magnetization switching of the storage layer 12 is applied to the storage layer 12.

When the magnetization alignment of the MTJ Element 400 is changed from the AP state to the P state, the spin torque of spin (electron) whose a direction is the same as a magnetization direction of the reference layer 111, is applied to the magnetization of the storage layer 12. When the direction of magnetization of the storage layer 12 is opposite to that of magnetization of the reference layer 111, the direction of magnetization of the storage layer 12 is changed to the same direction as that of magnetization of the reference layer 111 by the applied spin torque.

As a result, the magnetization alignment of the MTJ element 400 is set in the P state. Incidentally, when the spin torque of spin whose a direction is the same as a magnetization direction of the reference layer 111 is applied the storage layer 12 of the MTJ element 400 in the P state, the direction of magnetization of the storage layer 12 is not changed. The MTJ element 400 is therefore maintained in the P state.

When the magnetization alignment of the MTJ Element 400 is changed from the P state to the AP state, the spin torque of spin whose a direction is opposite to a magnetization direction of the reference layer 111 is applied to the magnetization of the storage layer 12. When the direction of magnetization of the storage layer 12 is the same as that of magnetization of the reference layer 111, the direction of magnetization of the storage layer 12 is changed to a direction opposite to that of magnetization of the reference layer 111 by the applied spin torque.

As a result, the magnetization alignment of the MTJ element 400 is set in the AP state. Incidentally, when the spin torque of spin whose a direction is opposite to a magnetization direction of the reference layer 111 is applied the storage layer 12 of the MTJ element 400 in the AP state, the direction of magnetization of the storage layer 12 is not changed. The MTJ element 400 is therefore maintained in the AP state.

When the resistance value of the MTJ element 400 is discriminated, read current is supplied to the MTJ element 400. The current value of the read current is set to a value that is smaller than the magnetization switching threshold value of the storage layer 12. Based upon the magnitude of the value (e.g. a current value and a voltage value) output from the MTJ element 400 that is supplied with the read current, the resistance value (magnetization alignment state) of the MTJ element 400 is equivalently discriminated.

In the MTJ element 400 of the present embodiment, the stack 19 is provided between the SAF-structure magnetic material 11 and the lower electrode 30. The stack. 19 is a nonmagnetic material. Hereinafter, the stack 19 will be referred to as an underlying layer 19.

The underlying layer 19 is a stack including a first layer 191 and a second layer 192. The first layer 191 and second layer 192 are stacked in the Z direction.

The first layer 191 is provided between the lower electrode 30 and the second layer 192. The second layer 192 is provided between the magnetic material 11 and the first layer 191. The second layer 192 is in direct contact with, for example, the shift cancellation layer 115.

The first and second layers 191 and 192 are, for example, crystal layers. The first and second layers 191 and 192 function as buffer layers for crystal growth of the magnetic material 11 (magnetic layer 115) at the time of formation of the magnetic material 11. Hereinafter, the first layer 191 and the second layer 192 will be referred to as a first buffer layer and a second buffer layer. The second buffer layer 192 is provided above the first buffer layer 191 in the Z direction. A stack-structure buffer layer (layer 190 in FIG. 1) is formed by the layers 191 and 192.

For example, the first buffer layer 191 improves the crystallinity (orientation) of the second buffer layer 192. The second buffer layer 192 improves the crystallinity (orientation) of the magnetic layer on the second buffer layer 192.

The second buffer layer (crystal layer) 192 preferably has a crystal structure similar to the crystal structure of a layer (here, the shift cancellation layer 115) that is in contact with the second buffer layer 192. When, for example, a material having a crystal orientation (crystal structure) of fcc (111) and/or hcp (0002) is used for the shift cancellation layer 115, the second buffer layer 192 preferably has, for example, a crystal orientation of fcc (111) and/or hcp (0002).

For example, the material of the first buffer layer 191 is tantalum (Ta). For example, the material of the second buffer layer 192 is selected from among ruthenium (Ru), rhodium (Rh), palladium (Pd), osmium (Os), iridium (Ir), platinum (Pt) and the like. In this case, for example, a CoPt-based material is used for the material of the shift cancellation layer 115 (and the reference layer 111).

Neither the material of the first buffer layer 191 nor the material of the second buffer layer 192 is limited to the above example. The combination of materials of the first buffer layer 191, second buffer layer 192 and shift cancellation layer 115 is preferably selected appropriately in consideration of, e.g. the thermal expansion coefficient, lattice constant and crystal structure of the materials (layers).

For example, the underlying layer 19 includes a layer 199 other than the first buffer layer 191 and the second buffer layer 192.

The layer (also referred to as a spacer layer hereinafter) 199 is provided between the lower electrode 30 and the first buffer layer 191. The layer 199 is, for example, an amorphous layer. The layer 199 is preferably a metal layer or a compound layer having conductivity (e.g., a boride layer or a nitride layer). The material of the layer 199 is, for example, hafnium boride (HfB).

The thickness of the amorphous layer 199 is not less than the total of the thickness of the buffer layer 191 and that of the buffer layer 192. The thickness of the amorphous layer 199 and those of the buffer layers 191 and 192 are dimensions in a direction perpendicular to the surface of the substrate 80 (Z direction).

Note that the spacer layer may be treated as part of the lower electrode 30.

In the present embodiment, the underlying layer 19 including an amorphous layer and a buffer layer (crystal layer) improves the magnetic properties of the magnetic layer included in the SAF structure.

As a result, the characteristics of the MTJ element 400 of the present embodiment is improved.

(c) Characteristics

The characteristics of the MTJ element according to the present embodiment will be described with reference to FIGS. 3 through 9.

Figure 3:
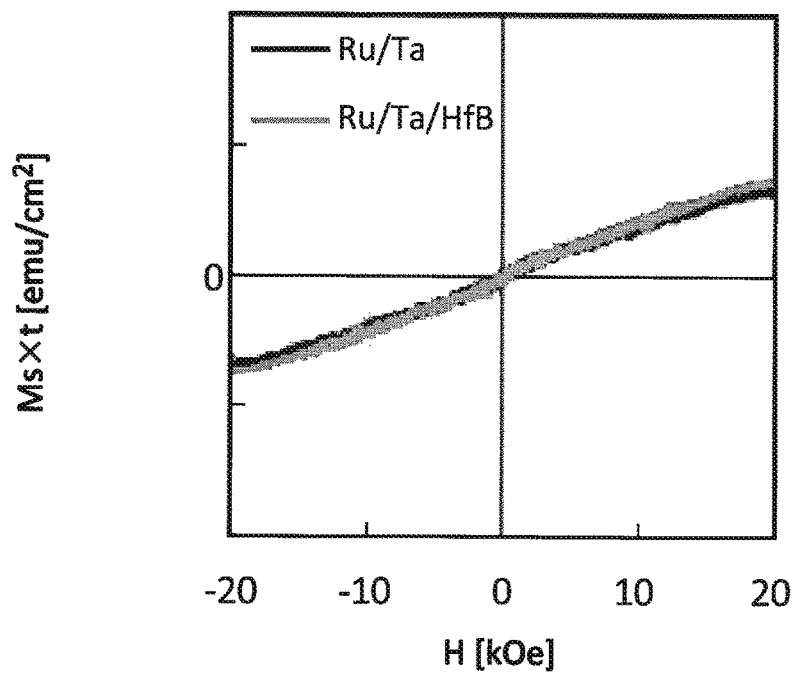

FIG. 3 is a graph showing an example of the characteristics of the underlying layer in the MTJ element of the present embodiment.

In the graph of FIG. 3, the horizontal axis represents to a magnetic field (H[kOe]) and the vertical axis represents Ms×t (product of saturation magnetization and film thickness) ([emu/cm$^2$]).

FIG. 3 shows the magnetic properties of an Ru/Ta/HfB layer as an example of the present embodiment. FIG. 3 also shows the magnetic properties of an Ru/Ta layer as a comparative example of the Ru/Ta/HfB layer. In the following, the case where a stack (multi-layer film) including a layer "A" and a layer "B" is represented by "A/B" means that the layer "A" is stacked on the top surface of the layer "B."

In the Ru/Ta/HfB layer, the thickness of the Ru layer is 2.0 nm, the thickness of the Ta layer is 1.0 nm and the thickness of the HfB layer is 2.0 nm. In the Ru/Ta layer of the comparative example, the thickness of the Ru layer is 2.0 nm and the thickness of the Ta layer is 2.0 nm.

As shown in FIG. 3, a tendency to the magnetic properties of the Ru/Ta/HfB layer exhibits substantially the same as a tendency to the magnetic properties of the Ru/Ta layer, regardless of the presence or absence of HfB.

When an MTJ element including a shift cancellation layer is formed using the underlying layer of the Ru/Ta/HfB layer, the HfB layer of amorphous having no crystal properties (crystal information) prevents the crystal properties of the substrate from being reflected in (transferred to) the crystal properties of the magnetic layer on the underlying layer. Furthermore, a relatively flat underlying layer is formed by the amorphous layer.

The above improves the crystal properties of the magnetic layer that is in contact with the underlying layer and the characteristics of a stack including the magnetic layer (e.g. a magnetic tunnel junction).

For example, in the MTJ element having the structure shown in FIG. 2, the deterioration of the characteristics of the shift cancellation layer due to the crystal properties of the substrate is suppressed. Accordingly, the characteristics of the shift cancellation layer are improved, as are the characteristics of the SAF structure of the shift cancellation layer and the reference layer.

As a result, the characteristics (e.g. reliability and/or TMR characteristics) of the MTJ element of the present embodiment are improved.

Figure 4:
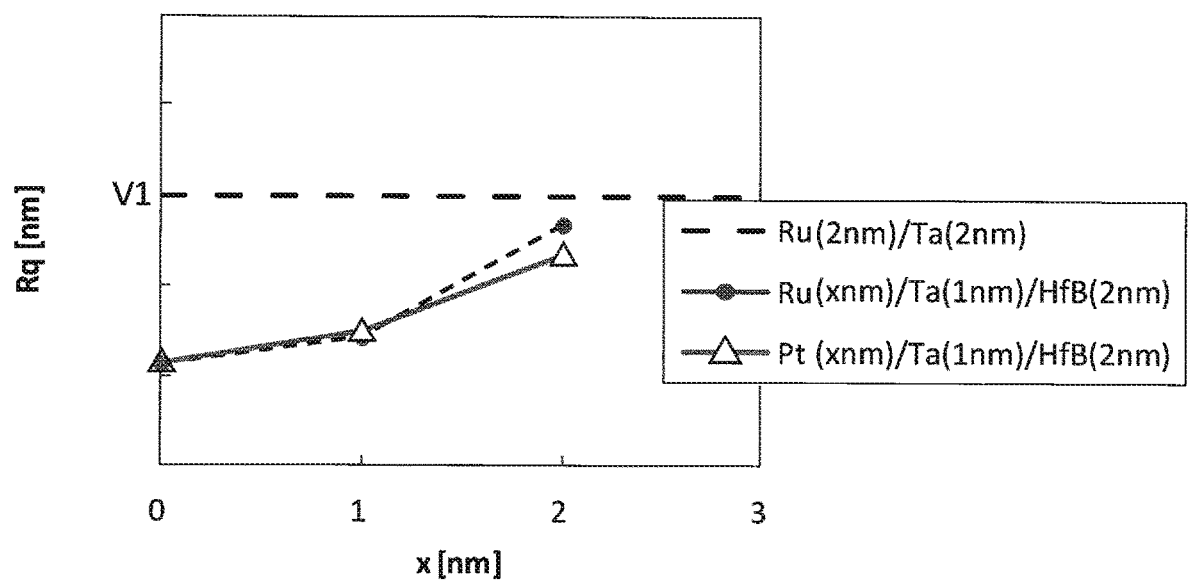

FIGS. 4 through 6 show the relationship between variations of thickness of the buffer layer of the underlying layer and the characteristics of the magnetic material and magnetoresistive effect element.

In FIGS. 4 through 6, as an example of the underlying layer of the present embodiment, a Pt/Ta layer is used in the buffer layer and an HfB layer is used in the amorphous layer. As another example of the underlying layer, a Ru/Ta layer is used in the buffer layer and an HfB layer is used in the amorphous layer. The amorphous layer is provided between the substrate and the buffer layer.

FIGS. 4 through 6 show an underlying layer (Ru/Ta layer) having a stack structure of Ru and Ta layers as a comparative value. In the Ru/Ta layer of the comparative value, the Ru layer has a thickness of 2 nm and the Ta layer also has a thickness of 2 nm.

As shown in FIGS. 4 through 6, the thickness×of the buffer layer varies in the range from 0 nm to 2 nm.

FIG. 4 is a graph showing an example of the magnetic characteristics of the magnetic material on the underlying layer in the present embodiment.

In the graph of FIG. 4, the horizontal axis represents the thickness×of the buffer layer and the vertical axis represents the surface roughness (surface morphology) Rq of the magnetic layer on the buffer layer. Note that the surface roughness (surface morphology) Rq is an index representing the irregularities of the surface of the layer.

As shown in FIG. 4, the thickness×of the buffer layer varies in the range from 0 nm to 2 nm. Hereinafter, the buffer layer of a Pt layer will be referred to as a Pt buffer layer and the buffer layer of a Ru layer will be referred to as a Ru buffer layer.

As shown in FIG. 4, in the stack structure of the amorphous layer and the Pt buffer layer (Pt/Ta/HfB layer), the surface roughness (Rq) of the magnetic material (e.g. SAF structure) on the Pt buffer layer is smaller than a comparative value V1 if the thickness of the Pt buffer layer is 2 nm or less.

Similarly, in the stack structure of the amorphous layer and the Ru buffer layer (Ru/Ta/HfB layer), the surface roughness (Rq) of the magnetic material on the Ru buffer layer is smaller than the comparative value V1 if the thickness of the Ru buffer layer is 2 nm or less.

FIG. 5 is a graph showing an example of the magnetic characteristics of the magnetic material on the underlying layer in the present embodiment.

In the graph of FIG. 5, the horizontal axis represents the thicknessx[nm] of the buffer layer (Ru layer or Pt layer) and the vertical axis represents the strength Hex [Oe] of an exchange coupling magnetic field of the magnetic material (e.g. SAF structure) on the underlying layer.

As shown in FIG. 5, the thicknessxof the buffer layer varies in the range from 0 nm to 2 nm.

As shown in FIG. 5, when a Pt layer is used in the buffer layer, the strength Hex of the exchange coupling magnetic field of the magnetic material on the Pt buffer layer can be not smaller than a comparative value V2 if the thickness of the Pt buffer layer is 1 nm or more.

When a Ru layer is used in the buffer layer, the strength Hex of the exchange coupling magnetic field of the magnetic material on the Ru buffer layer can be almost equal to the comparative value V2 if the thickness of the Ru buffer layer is 2 nm or more.

FIG. 6 is a graph showing an example of the characteristics of the magnetoresistive effect element on the underlying layer in the present embodiment.

In the graph of FIG. 6, the horizontal axis represents the thicknessx[nm] of the buffer layer (Ru layer or Pt layer) and the vertical axis represents the tunnel magnetic resistance ratio (TMR ratio) of the magnetoresistive effect element (MTJ element).

As shown in FIG. 6, the thicknessxof the buffer layer varies in the range from 0 nm to 2 nm.

As shown in FIG. 6, when the Pt layer is used as a buffer layer, the value of the TMR ratio of the magnetoresistive effect element is larger than a comparative value V3.

When the Ru layer is used as a buffer layer, the TMR ratio of the magnetoresistive effect element is maintained at almost the comparative value V3.

Therefore, when the Pt layer is used in the buffer layer of the underlying layer, if the thickness of the Pt buffer layer is 1 nm or more and 2 nm or less, the magnetoresistive effect element on the buffer layer can be improved in its flatness, magnetic properties and TMR ratio.

Figure 7:
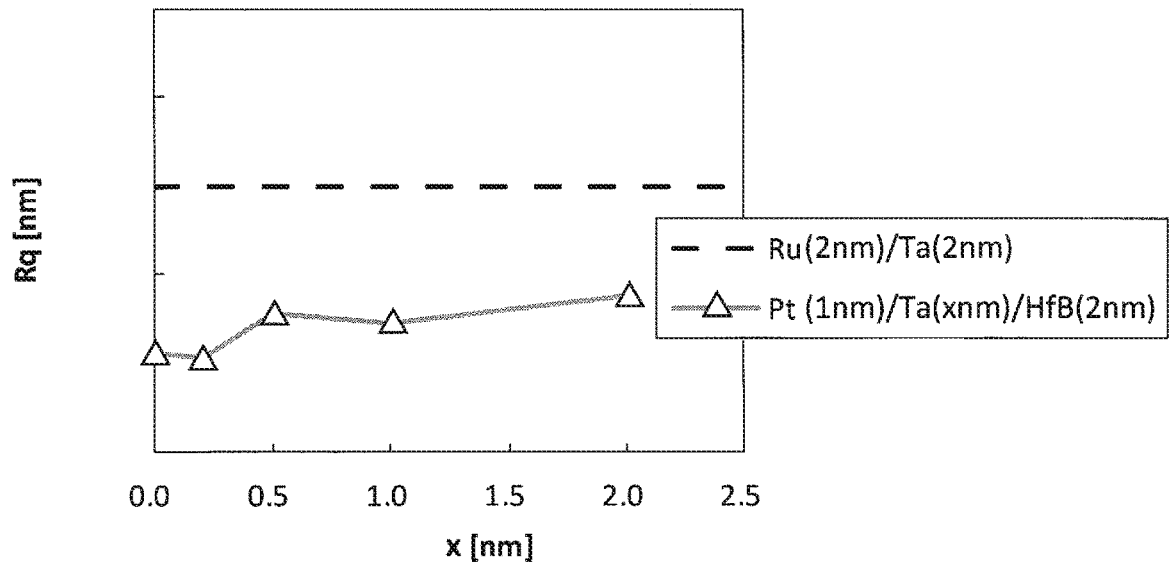
Figure 8:
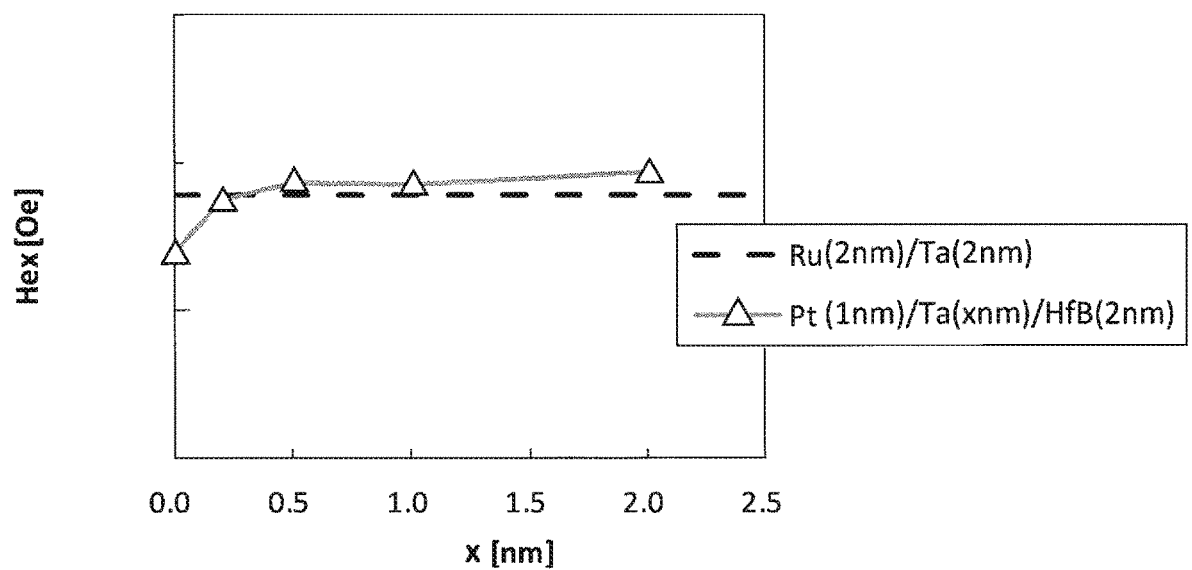
Figure 9:
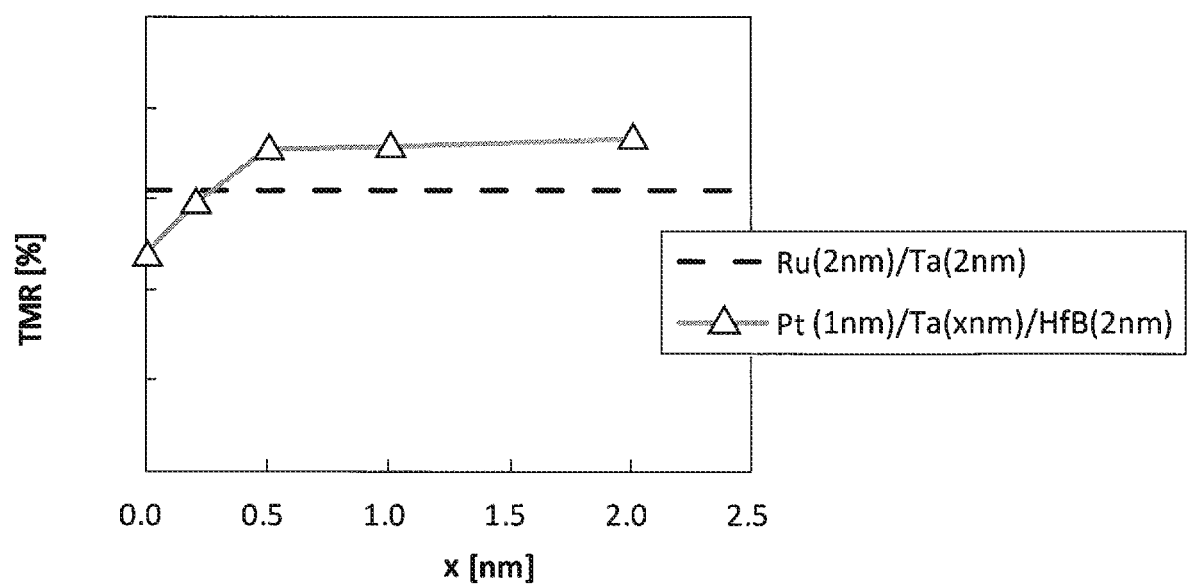

FIGS. 7 through 9 show the relationship between variations of thickness of the buffer layer of the underlying layer and the characteristics of the magnetic material and magnetoresistive effect element.

In FIGS. 7 through 9, as in the example of FIGS. 4 through 6, a Pt/Ta layer is used in the buffer layer and an HfB layer is used in the amorphous layer as an example of the underlying layer. The Ta layer is provided between the HfB layer and the Pt layer.

Like FIGS. 4 through 6, FIGS. 7 through 9 show a characteristic value of an underlying layer of a Ru/Ta layer as a comparative value. In the underlying layer of the comparative value, the Ru layer has a thickness of 2 nm and the Ta layer also has a thickness of 2 nm.

As shown in FIGS. 7 through 9, the thicknessxof the buffer layer varies in the range from 0 nm to 2 nm.

FIG. 7 is a graph showing an example of the characteristics of the magnetic material on the underlying layer in the present embodiment.

In the graph of FIG. 7, the horizontal axis represents the thicknessxof the buffer layer and the vertical axis represents the surface roughness Rq of the magnetic material. Hereinafter, the Ta layer of the buffer layer will be referred to as a Ta buffer layer.

When the Ta buffer layer is provided between the Pt buffer layer and the HfB layer, the value of the surface roughness Rq of the magnetic material (e.g. SAF structure) is smaller than a comparative value V4 even though the Ta buffer layer is formed to the thickness of 2 nm.

FIG. 8 is a graph showing an example of the characteristics of the magnetic material on the underlying layer in the present embodiment.

In the graph of FIG. 8, the horizontal axis represents the thicknessx[nm] of the Ta buffer layer and the vertical axis represents the strength Hex [Oe] of an exchange coupling magnetic field of the magnetic material on the underlying layer.

Since, as shown in FIG. 8, the Ta buffer layer having a thickness of 0.5 nm or more is provided between the Pt layer and the HfB layer, the strength Hex of the exchange coupling magnetic field of the magnetic material on the Pt/Ta/HfB layer is not less than a comparative value V5.

FIG. 9 is a graph showing an example of the characteristics of the MTJ element in the present embodiment.

In the graph of FIG. 9, the horizontal axis represents the thicknessx[nm] of the Ta buffer layer and the vertical axis represents the tunnel magnetic resistance ratio (TMR ratio) of the magnetoresistive effect element (MTJ element).

Since, as shown in FIG. 9, the Ta buffer layer having a thickness of 0.5 nm or more is provided between the Pt layer and the HfB layer, the TMR ratio of the MTJ element is higher than a comparative value V6.

Therefore, when the Ta layer having a thickness of 0.5 nm or more is provided in the underlying layer as in the present embodiment, the magnetoresistive effect element (magnetic layer) on the buffer layer can be improved in its flatness, magnetic properties and TMR ratio.

Based on the experimental results of FIGS. 7 through 9, the thickness of the Ta layer as the first buffer layer 191 can be set to 0.5 nm or more, preferably 2.0 nm or less. For example, the thickness of the Ta layer is set in a range from 0.5 nm to 1.0 nm. For example, the thickness of the first buffer layer (Ta layer) 191 is not less than that of the second buffer layer 192.

Note that the thickness of the first buffer layer 191 is not limited to the examples of FIGS. 7 through 9 but may be larger than 2.0 nm in accordance with the material for use. For example, the thickness of the first buffer layer 191 may be equal to or smaller than that of the second buffer layer (crystal layer) 192.

As shown in FIGS. 3 through 9 described above, in the present embodiment, a magnetic material (e.g. SAF structure) is provided on the underlying layer having a stack structure including an amorphous layer and a buffer layer, with the result that the magnetic material and the MTJ element are improved in their characteristics.

(d) Summary

In the magnetoresistive effect element (e.g. the MTJ element) as a magnetic device of the present embodiment, a magnetic material constituting the element is provided on the underlying layer. The underlying layer has a stack structure of an amorphous layer and a buffer layer. The buffer layer is, for example, a crystal layer.

The amorphous layer is provided between the buffer layer and the substrate. The buffer layer is provided between the magnetic material and the amorphous layer.

In the present embodiment, the amorphous layer having substantially no crystallinity can prevent the crystal properties (e.g., a crystal defect, orientation of crystal, and a lattice mismatch) of a layer (e.g. an electrode, a contact plug and a substrate) under the amorphous layer from being propagated to a layer (e.g. a buffer layer and a magnetic material) above the amorphous layer.

For example, the amorphous layer has a relatively flat surface.

In the present embodiment, the buffer layer has a relatively flat surface (top surface) in accordance with the flatness of the amorphous layer. The buffer layer also has relatively good crystallinity according to the flat amorphous layer. In the present embodiment, therefore, the buffer layer depends upon the crystallinity of the buffer layer and can promote the crystal growth of the magnetic material provided on the buffer layer. Thus, the magnetic material formed on the surface of the buffer layer has relatively good crystallinity. As a result, the magnetic properties of the magnetic material are improved in the present embodiment.

For example, when the shift cancellation layer is provided closer to the substrate than the storage layer and the reference layer as in the example of FIG. 2, the characteristics of the shift cancellation layer may have a significant effect on the characteristics of the magnetoresistive effect element. The present embodiment can improve the characteristics of the magnetic layer used in the shift cancellation layer.

As described above, the magnetoresistive effect element of the present embodiment can improve the robustness against substrate types by the stack structure of the amorphous layer and the buffer layer (crystal layer).

Therefore, the magnetoresistive effect element of the present embodiment can improve in its characteristics (e.g. TMR ratio).

As described above, the magnetic device (magnetoresistive effect element) of the present embodiment can improve in its characteristics.

(2) Modification

A modification to the magnetoresistive effect element of the present embodiment will be described with reference to FIG. 10.

Figure 10:
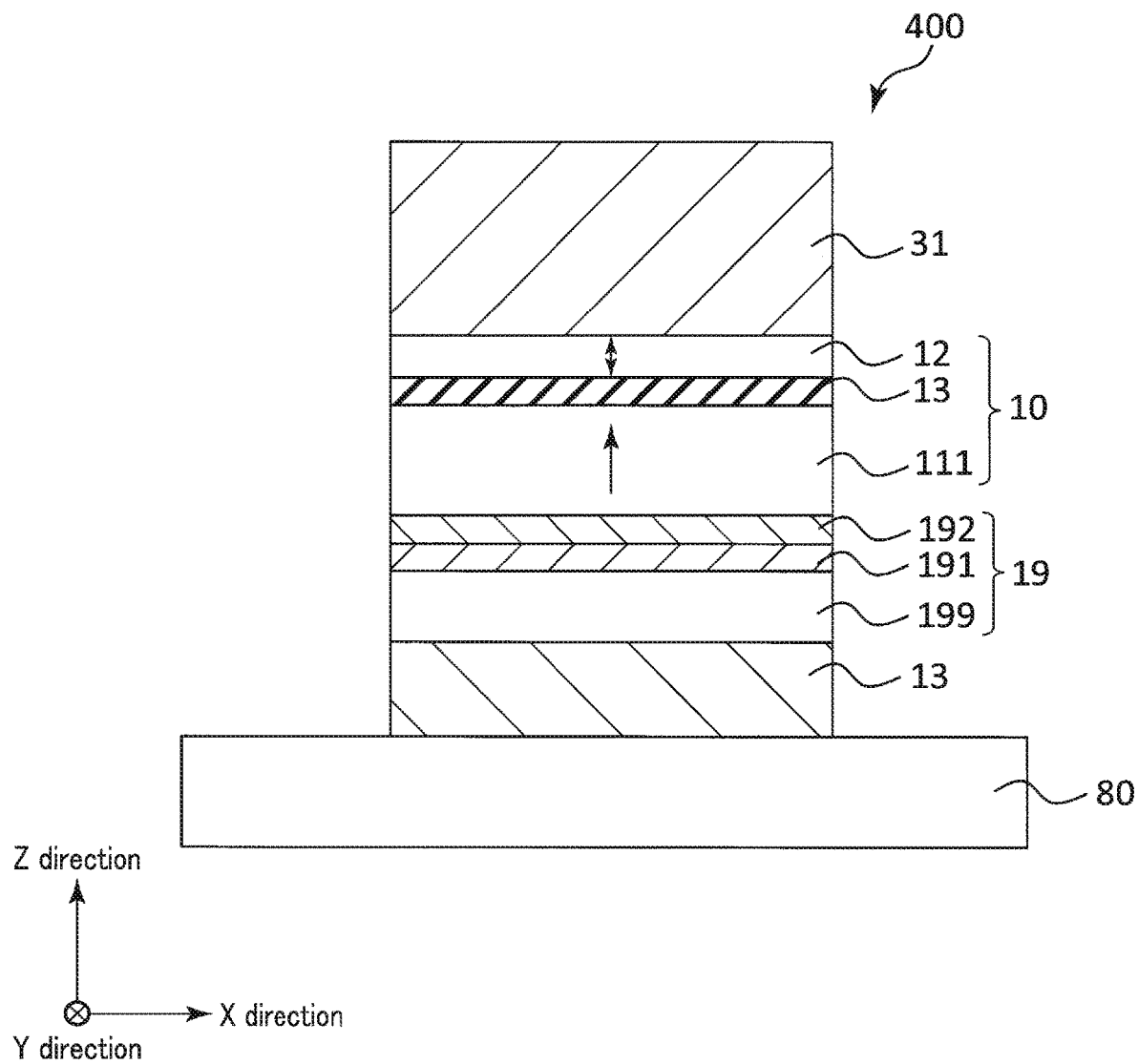
FIG. 10 is a diagram illustrating a modification to the magnetic device according to the embodiment.

FIG. 10 is a sectional view showing a modification to the magnetic device (e.g. MTJ element) of the present embodiment.

As shown in FIG. 10, an MTJ element 400 of the modification includes no shift cancellation layer.

In the modification, the underlying layer 19 includes a first buffer layer (crystal layer) 191, a second buffer layer (crystal Layer) 192 and a spacer layer (amorphous layer) 199.

Thus, the MTJ element 400 (reference layer 111) is improved in its flatness and magnetic properties.

As a result, the MTJ element of the modification is improved in its characteristics.

Note that the order of lamination of the reference layer 111 and the storage layer 12 in the stack 10 may be opposite to that in the examples shown in FIGS. 2 through 10. In this case, the storage layer 12 is provided on the underlying later 19. The reference layer 111 is provided above the storage layer 12 in the Z direction with the tunnel barrier layer 13 therebetween. If the MTJ element 400 has an SAF structure, a shift cancellation layer and a metal layer is provided between the reference layer and the upper electrode.

(3) Application Example

An application example of the magnetic device of the embodiment will be described with reference to FIGS. 11 through 13.

Figure 11:
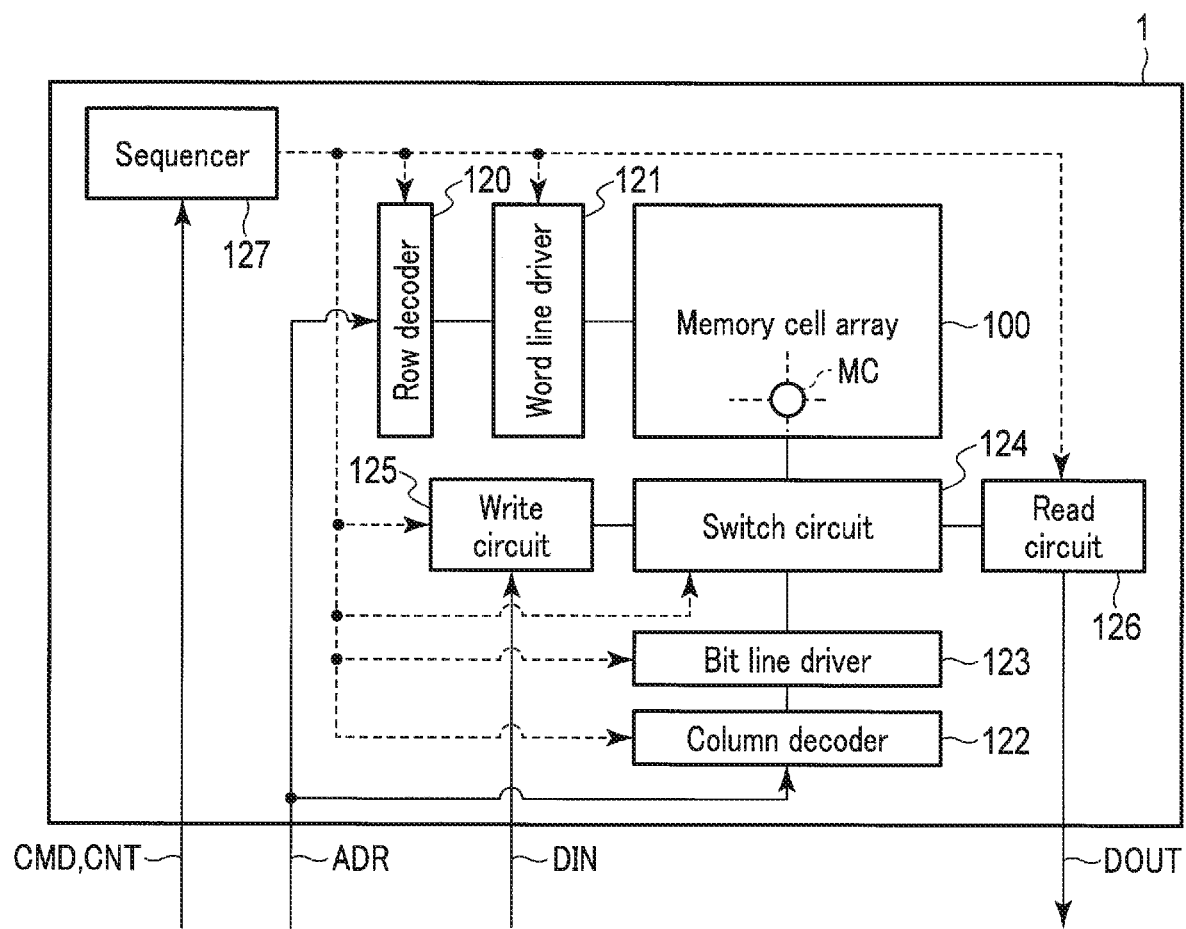

FIG. 11 is a diagram illustrating an application example of the magnetic device of the present embodiment.

The magnetic device (e.g. MTJ Element) of the present embodiment is applied to a memory device.

As shown in FIG. 11, a memory device 1 including the magnetic device of the present embodiment is electrically connected to, for example, an external device such as a controller, a processor and a host device.

The memory device 1 receives a command CMD, an address ADR, input data DIN and various control signals CNT from the external device. The memory device 1 transmits output data DOUT to the external device.

As shown in FIG. 11, the memory device 1 includes at least a memory cell array 100, a row decoder 120, a word line driver (row control circuit) 121, a column decoder 122, a bit line driver (column control circuit) 123, a switch circuit 124, a write circuit (write control circuit) 125, a read circuit (read control circuit) 126 and a sequencer 127.

The memory cell array 100 includes a plurality of memory cells MC.

The row decoder 120 decodes a row address included in the address ADR.

Based on the decoding result of the row address, the word line driver 121 selects a row (e.g. a word line) of the memory cell array 100. The word line driver 121 can apply a predetermined voltage to the word line.

The column decoder 122 decodes a column address included in the address ADR.

Based on the decoding result of the column address, the bit line driver 123 selects a column (e.g. a bit line) of the memory cell array 100. The bit line driver 123 is connected to the memory cell array 100 via the switch circuit 124. The bit line driver 123 can apply a predetermined voltage to the bit line.

The switch circuit 124 connects one of the write circuit 125 and read circuit 126 to the memory cell array 100 and the bit line driver 123. Thus, the MRAM 1 performs an operation corresponding to the command.

During write operation, the write circuit 125 supplies various voltages and/or currents for writing data to a memory cell selected based on the address ADR. For example, the data DIN is supplied to the write circuit 124 as data to be written to the memory cell array 100. Thus, the write circuit 125 writes the data DIN to the memory cell MC. the write circuit 125 includes a write driver/sinker.

During read operation, the read circuit 126 supplies various voltages and/or currents for reading data to a memory cell selected based on the address ADR. Accordingly, data is read from the memory cell MC.

The read circuit 126 outputs the data read from the memory cell array 100, to the outside of the memory device 1 as output data DOUT.

The read circuit 126 includes a read driver, a sense amplifier circuit and the like.

The sequencer 127 receives the command CMD and various control signals CNT. In response to the command CMD and control signals CNT, the sequencer 127 controls the operations of the circuits 120 to 126 in the memory device 1. The sequencer 127 can transmit the control signals CNT to an external device in accordance with the operating status of the interior of the memory device 1.

For example, the sequencer 127 holds various items of information about the write and read operations as setting information.

Note that different signals CMD, CNT, ADR, DIN and ROUT may be supplied to a predetermined circuit in the memory device 1 via an interface circuit provided separately from the chip (package) of the memory device 1 and may be supplied to the circuits 120 to 127 from an input/output circuit (not shown) in the memory device 1.

For example, in the present embodiment, the memory device 1 is a magnetic memory. In the magnetic memory (e.g. MRAM), the magnetoresistive effect element as the magnetic device of the present embodiment is used in a memory element in the memory cell MC.

<Internal Configuration of Memory Cell Array>

Figure 12:
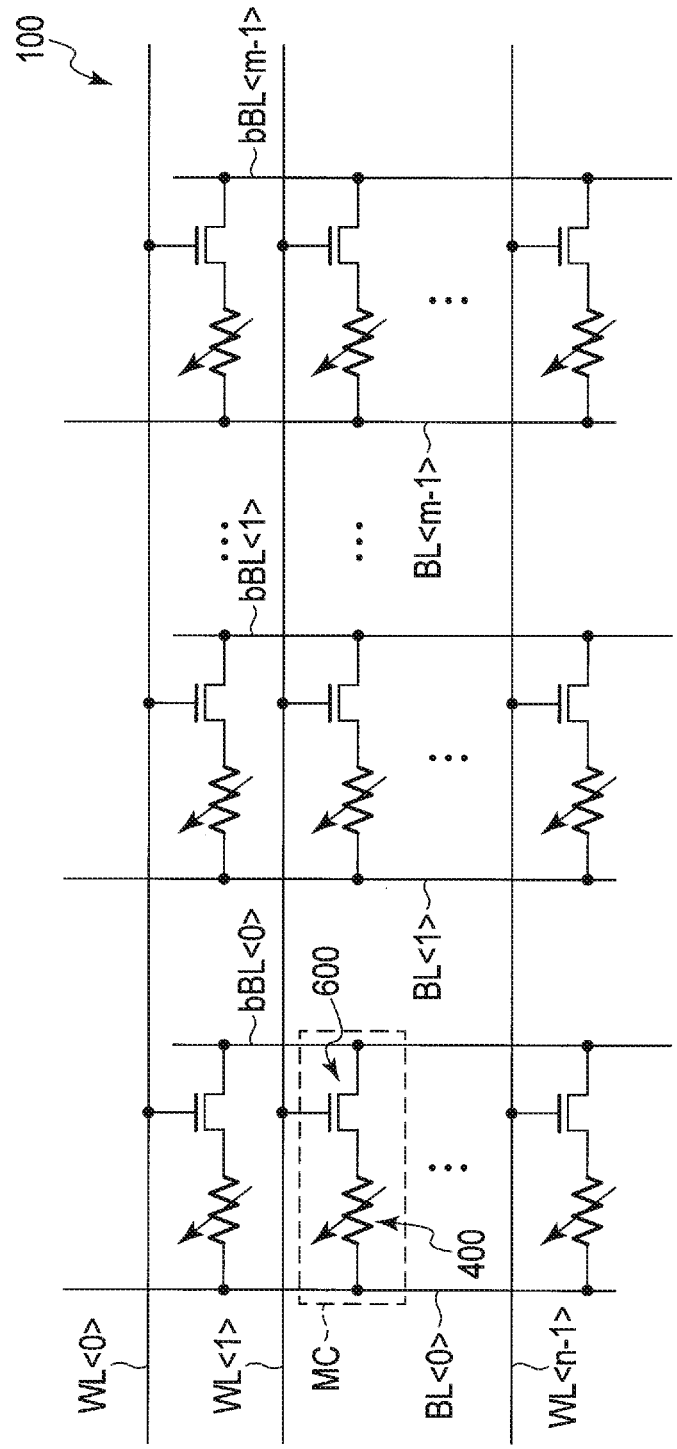

FIG. 12 is an equivalent circuit diagram showing an example of the internal configuration of the memory cell array of the MRAM according to the present embodiment.

As shown in FIG. 12, a plurality of (n) word lines WL (WL<0>, WL<1>, WL<n−1>) are provided in the memory cell array 100. A plurality of (m) bit lines BL (BL<0>, BL<1>, . . . ,BL<m−1>) and a plurality of (m) bit lines bBL (bBL<0>, bBL<1>, . . . , bBL<m−1>) are provided in the memory cell array 100. One bit line BL and one bit line bBL constitute a bit line pair. For clarification of the description, the bit lines bBL may be referred to as source lines.

The memory cells MC are arranged in matrix in the memory cell array 100.

The memory cells MC arranged in the D1 direction (row direction) are connected to a common word line WL. The word line WL is connected to the word line driver 121. The word line driver 121 controls the potential of the word line WL based on a row address. Thus, the word line WL (row) represented by the row address is selected and activated.

The memory cells MC arranged in the D2 direction (column direction) are connected in common to two bit lines BL and bBL belonging to one bit line pair. The bit lines BL and bBL are connected to the bit line driver 123 through the switch circuit 124.

The switch circuit 124 connects the bit lines BL and bBL corresponding to a column address to the bit line driver 123. The bit line driver 123 controls the potentials of the bit lines BL and bBL. Thus, the bit line BL and bBL (column) represented by the column address are selected and activated.

The switch circuit 124 connects the selected bit lines BL and bBL to the write circuit 125 or the read circuit 126 in accordance with the operation requested by the memory cell MC.

For example, each of the memory cells MC includes a single magnetoresistive effect element 400 and a single cell transistor 600.

One end of the magnetoresistive effect element 400 is connected to the bit line BL. The other end of the magnetoresistive effect element 400 is connected to one end (one of the source/drain) of the cell transistor 600. The other end (the other of the source/drain) of the cell transistor 600 is connected to the bit line bBL. The word line WL is connected to the gate of the cell transistor 600.

The memory cell MC may include two or more magnetoresistive effect elements 400 and may include two or more cell transistors 600.

The memory cell array 100 may have a configuration of a hierarchical bit line system. In this case, a plurality of global bit lines are provided in the memory cell array 100. Each bit line BL is connected to one global bit line through the corresponding switch element. Each source line bBL is connected to the other global bit line through the corresponding switch element. The global bit lines are connected to the write circuit 125 and the read circuit 126 through the switch circuit 124.

The magnetoresistance effect element 400 functions as a memory element. The cell transistor 600 functions as a switching element of the memory cell MC.

For example, when the memory cell MC stores one-bit data ("0" data or "1" data), first data (e.g. "0" data) is associated with the MTJ element 400 in a state having a first resistance value R1 (first resistance state). Second data (e.g. "1" data) is associated with the MTJ element 400 in a state having a second resistance value R2 (second resistance state).

The resistance state (magnetization alignment) of the magnetoresistive effect element 400 varies with the supply of voltage or current of a certain magnitude to the magnetoresistive effect element 400. Accordingly, the magnetoresistive effect element 400 can be placed into a plurality of resistance states (resistance values). Data of one or more bits is associated with the resistance states of the magnetoresistive effect element 400. Thus, the magnetoresistive effect element 400 is used as a memory element.

Incidentally, in the present embodiment, a well-known data write operation (data write using, e.g. a magnetic field write method, a spin transfer torque (STT) method and/or a spin orbit torque (SOT) method) and a well-known data read operation (data read using, e.g. a DC method, a reference cell method and/or a self-reference method) can appropriately be applied to the operation of the MRAM including the magnetoresistive effect element 400. In this embodiment, therefore, the description of the operation of the MRAM including the MTJ element 400 of the present embodiment will be omitted.

<Configuration Example of Memory Cell>

FIG. 13 is a sectional view showing a configuration example of the memory cell of the MRAM according to the present embodiment.

As shown in FIG. 13, the memory cell MC is provided on the semiconductor substrate 80.

The cell transistor 600 is a transistor of any type. For example, the cell transistor 600 is an electric field effect transistor with a planar structure, an electric field effect transistor with a three-dimensional structure such as Fin-FET, or an electric field effect transistor with an embedded gate structure. Hereinafter, a cell transistor with a planar structure will be exemplified.

The cell transistor 600 is provided in an active region (semiconductor region) AA of the semiconductor substrate 80.

In the cell transistor 600, a gate electrode 61 is provided above the active region AA via a gate insulating film 62 therebetween. The gate electrode 61 extends in the depth direction (or the front direction) of FIG. 3. The gate electrode 61 functions as a word line WL.

The source/drain regions 63A and 63B of the cell transistor 600 are provided in the active region AA.

A contact plug 55 is provided on the source/drain region 63B. An interconnect (metal layer) 56 serving as a bit line bBL is provided on the contact plug 55. The contact plug 50 is provided on the source/drain region 63A.

The magnetoresistive effect element 400 is provided on the contact plug 50 and an interlayer insulating film 81. The magnetoresistive effect element 400 is provided in the interlayer insulating film 82.

The magnetoresistive effect element 400 of the present embodiment includes the stack 10 and the underlying layer 19 between the two electrodes 31 and 31. The stack 10 is a multilayer film having a magnetic tunnel junction.

The electrode 30 is provided on the contact plug 50. The electrode 31 is provided above the electrode 30 with the stack 10 and the underlying layer 19 therebetween. A via plug 51 is provided on the electrode 31. An interconnect (metal layer) 52 serving as a bit line BL is provided on the via plug 51 and the interlayer insulating film 82. A conductive layer (e.g. a metal layer) may be provided between the electrode 30 and the contact plug 50.

For example, an insulating film (also referred to as a protective film and a sidewall insulating film) 20 covers the side of the MTJ element 400. The protective film 20 is provided between the interlayer insulating film 82 and tunnel junction 10. The protective film 20 may be provided between each of the electrodes 30 and 31 and the interlayer insulating film 82.

The material of the protective film 20 is selected from silicon nitride, aluminum nitride, aluminum oxide and the like. The protective film 20 may be a single-layer film and a multilayer film.

The protective film 20 need not be formed. The shape of the protective film 20 shown in FIG. 13 can be adjusted as appropriate.

Note that FIG. 13 simply shows a configuration of the magnetic device according to the present embodiment. FIG. 13 also simply shows the stack 10 and the underlying layer (buffer layer and amorphous layer) 19. In the present embodiment, the configurations of the memory cell array and the memory cell are not limited to the examples shown in FIGS. 12 and 13.

As described above, in the present embodiment, the layer 19 including an amorphous layer and a buffer layer can improve the properties (e.g. magnetic properties) of the SAF structure including a reference layer and a shift cancellation layer.

Therefore, the magnetoresistive effect element of the present embodiment can improve element characteristics.

Accordingly, the memory device including the magnetoresistive element of the present embodiment can improve in its characteristics.

(Others)

In the foregoing embodiment, the magnetic device may be an MTJ element of an in-plane magnetization type. In this MTJ element, the magnetization of the storage layer 12, reference layer 111 and shift cancellation layer 115 is directed to a direction perpendicular to the stack direction of the layers 12, 111 and 115. The easy axis of magnetization of the layers 12, 111 and 115 is parallel to the surface (X-Y plane) of the magnetic layer 12.

In the foregoing embodiment, a three-terminal type field effect transistor is provided as a switching element (selector) of the memory cell. As the switching element, for example, a two-terminal type switching element may be used. For example, when a voltage to be applied between two terminals is not higher than a threshold voltage, the switching element is brought into a high-resistance state, such as an electrically nonconductive state. When the voltage is not lower than the threshold voltage, the state of the switching element is changed to a low-resistance state, such as an electrically conductive state. The switching element may have this function irrespective of the polarity of the voltage. The switching element may include at least one or more types of chalcogen elements selected from the group consisting of, e.g. tellurium (Te), selenium (Se) and sulfur (S). Alternatively, the switching element may include, for example, chalcogenide that is a compound including the above chalcogen elements. The switching element may also include at least one or more types of elements selected from the group consisting of boron (B), aluminum (Al), gallium (Ga), indium (In), carbon (C), silicon (Si), germanium (Ge), tin (Sn), arsenic (As), phosphorus (P) and antimony (Sb).

The two-terminal type switching element described above is connected to the magnetoresistive effect element via one or more conductive layers.

The above-described embodiment is directed to an example of applying the magnetic device (magnetoresistive effect element) of the present embodiment to the MRAM. However, the magnetic device of the present embodiment may be applied to a magnetic memory other than the MRAM. The magnetic device of the present embodiment may also be applied to a device (a magnetic head and/or a magnetic sensor) other than the memory device.

In the magnetic device (magnetoresistive element) of the present embodiment, a buffer layer (crystal layer) having a single-layer structure may also be provided between the magnetic layer and the spacer layer (amorphous layer). In this case, for example, no second buffer layer is provided between the first buffer layer and the spacer layer. In addition, a buffer layer having a three-layer structure may be provided between the magnetic layer and the spacer layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic device comprising:
   a first magnetic material provided above a substrate;
   a second magnetic material provided between the substrate and the first magnetic material;
   a nonmagnetic material provided between the first magnetic material and the second magnetic material;
   a first layer provided between the substrate and the second magnetic material and including an amorphous layer;
   a second layer provided between the amorphous layer and the second magnetic material and including a first crystal layer; and
   a third layer provided between the first layer and the second layer and including a second crystal layer having tantalum.

2. The magnetic device according to claim 1, wherein the second magnetic material includes a first magnetic layer, a second magnetic layer between the first magnetic layer and the second layer, and a nonmagnetic layer between the first magnetic layer and the second magnetic layer.

3. The magnetic device according to claim 1, wherein the second magnetic material has an SAF structure.

4. The magnetic device according to claim 1, wherein the amorphous layer includes a boride layer.

5. The magnetic device according to claim 1, wherein the first crystal layer includes one of ruthenium, rhodium, palladium, osmium, iridium, and platinum.

6. The magnetic device according to claim 1, wherein a thickness of the amorphous layer is equal to or thicker than a sum of a thickness of the second layer and a thickness of the crystal third layer.

7. The magnetic device according to claim 1, wherein a thickness of the second crystal layer is 0.5 nm or more and 2 nm or less.

8. The magnetic device according to claim 1, wherein a thickness of the first crystal layer is 1 nm or more and 2 nm or less.

9. A memory device comprising:
- a memory cell including a magnetic device, the magnetic device including:
  - a first magnetic material provided above a substrate;
  - a second magnetic material provided between the substrate and the first magnetic material;
  - a nonmagnetic material provided between the first magnetic material and the second magnetic material;
  - a first layer provided between the substrate and the second magnetic material and including an amorphous layer;
  - a second layer provided between the amorphous layer and the second magnetic material and including a first crystal layer; and
  - a third layer provided between the first layer and the second layer and including a second crystal layer having tantalum; and
- a control circuit configured to control an operation of the memory cell and provided on the substrate.

10. The memory device according to claim 9, wherein the second magnetic material includes a first magnetic layer, a second magnetic layer between the first magnetic layer and the second layer, and a nonmagnetic layer between the first magnetic layer and the second magnetic layer.

11. The memory device according to claim 9, wherein the second magnetic material has an SAF structure.

12. The memory device according to claim 9, wherein the amorphous layer includes a boride layer.

13. The memory device according to claim 9, wherein the first crystal layer includes one of ruthenium, rhodium, palladium, osmium, iridium, and platinum.

14. The memory device according to claim 9, wherein a thickness of the amorphous layer is equal to or thicker than a sum of a thickness of the second layer and a thickness of the third layer.

15. The memory device according to claim 9, wherein a thickness of the second crystal layer is 0.5 nm or more and 2 nm or less.

16. The memory device according to claim 9, wherein a thickness of the first crystal layer is 1 nm or more and 2 nm or less.

17. The magnetic device according to claim 1, wherein:
the amorphous layer comprises boride, and
the first crystal layer comprises one of platinum and ruthenium.

18. The memory device according to claim 9, wherein:
the amorphous layer comprises boride, and
the first crystal layer comprises one of platinum and ruthenium.

* * * * *